United States Patent
Ryo et al.

(10) Patent No.: US 9,620,355 B2
(45) Date of Patent: Apr. 11, 2017

(54) WAFER PROCESSING METHOD

(71) Applicant: DISCO CORPORATION, Tokyo (JP)

(72) Inventors: Senichi Ryo, Tokyo (JP); Hirokazu Matsumoto, Tokyo (JP); Toshiyuki Yoshikawa, Tokyo (JP); Yukinobu Ohura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/215,125

(22) Filed: Jul. 20, 2016

(65) Prior Publication Data
US 2017/0025269 A1 Jan. 26, 2017

(30) Foreign Application Priority Data

Jul. 24, 2015 (JP) .................................. 2015-147126

(51) Int. Cl.
| | | |
|---|---|---|
| *H01L 21/78* | (2006.01) | |
| *H01L 21/02* | (2006.01) | |
| *H01L 21/683* | (2006.01) | |
| *H01L 23/544* | (2006.01) | |

(52) U.S. Cl.
CPC .... *H01L 21/02076* (2013.01); *H01L 21/6836* (2013.01); *H01L 21/78* (2013.01); *H01L 23/544* (2013.01); *H01L 21/02041* (2013.01); *H01L 21/02098* (2013.01); *H01L 2221/68327* (2013.01); *H01L 2223/5446* (2013.01)

(58) Field of Classification Search
CPC ......... H01L 21/02002; H01L 21/02041; H01L 21/02098; H01L 21/78; H01L 21/7806; H01L 21/6836; H01L 21/6835; H01L 2221/68327; H01L 2221/6834; H01L 2221/68354; H01L 2223/54453; H01L 2221/5446
See application file for complete search history.

(56) References Cited

U.S. PATENT DOCUMENTS

| | | | | |
|---|---|---|---|---|
| 8,216,867 B2* | 7/2012 | Donofrio | ............ | H01L 33/0079 257/E21.347 |
| 2009/0020771 A1* | 1/2009 | Kim | .................... | H01L 33/0079 257/94 |
| 2014/0248758 A1* | 9/2014 | Weiss | ..................... | B23K 26/38 438/463 |
| 2015/0279778 A1* | 10/2015 | Camacho | ................ | H01L 21/56 257/737 |
| 2016/0218067 A1* | 7/2016 | Masuko | ................ | H01L 23/562 |

FOREIGN PATENT DOCUMENTS

JP 2010-012508 1/2010

* cited by examiner

*Primary Examiner* — Thanh T Nguyen
(74) *Attorney, Agent, or Firm* — Greer Burns & Crain, Ltd.

(57) ABSTRACT

A wafer processing method includes a wafer holding step of holding a wafer having devices formed on the front side, a protective film forming step of forming a water-soluble protective film on the front side of the wafer, a laser beam applying step of applying a laser beam to the wafer along streets, a cleaning step of cleaning the wafer to then remove the protective film, and a foreign matter removing step of removing foreign matter from the wafer when a predetermined period of time has elapsed after cleaning. This period of time is set as a period of time until a phosphorus containing reaction product produced at a laser processed portion is evaporated to react with water in the air, thereby producing the foreign matter containing phosphorus on bumps formed on each device.

4 Claims, 10 Drawing Sheets

WAFER PROCESSING METHOD

BACKGROUND OF THE INVENTION

Field of the Invention

The present invention relates to a wafer processing method.

Description of the Related Art

In general, the fabrication of devices such as integrated circuits (ICs) and large scale integrations (LSIs) includes the steps of setting a plurality of crossing streets (division lines) on the front side of a wafer to thereby partition the front side of the wafer into a plurality of chip regions and then individually forming the devices in these chip regions. The devices formed on the front side of the wafer are divided from each other by laser processing such that a laser beam is applied to the wafer along the streets to thereby form a laser processed groove along each groove on the front side of the wafer.

In this kind of laser processing, fine dust particles called debris are generated and scattered from the wafer in applying the laser beam. This debris is deposited on the front side of each device to cause a reduction in quality of each device. To cope with this problem, there has been proposed a processing method including the steps of forming a protective film on the front side of a wafer, next performing laser processing to the wafer with the protective film, and next cleaning the wafer to thereby remove the protective film and the debris deposited thereon (see Japanese Patent Laid-Open No. 2010-012508, for example).

SUMMARY OF THE INVENTION

In the case that the substrate of the wafer is formed of a phosphorus compound and metal electrodes such as bumps are formed on the front side of each device, the element (e.g., phosphorus) constituting the wafer is liberated and diffused by the laser processing. It was found that this diffused element reacts with nitrogen, oxygen, or water in the air after removing the protective film, thereby producing foreign matter on the metal electrodes. This foreign matter causes a reduction in characteristics (e.g., electrical characteristics) of each device and it is therefore preferable to remove the foreign matter at once. However, since the production speed of the foreign matter is low, it is difficult to remove the foreign matter together with the protective film in removing the protective film. Furthermore, even when changing laser processing conditions or the composition of the protective film in performing the laser processing, the production of the foreign matter cannot be sufficiently suppressed.

It is therefore an object of the present invention to provide a wafer processing method which can suppress the production of the foreign matter.

In accordance with an aspect of the present invention, there is provided a wafer processing method for laser processing a wafer along a plurality of crossing streets formed on a front side of a substrate, the front side of the substrate being partitioned by the streets to define a plurality of separate regions where a plurality of devices each having metal electrodes are formed, the substrate being formed of a phosphorus compound. The wafer processing method includes a wafer holding step of holding the wafer on a chuck table, a protective film forming step of forming a water-soluble protective film on the front side of the wafer held on the chuck table, a laser beam applying step of applying a laser beam to the wafer along the streets after performing the protective film forming step, a cleaning step of cleaning the wafer to thereby remove the protective film after performing the laser beam applying step. Further, the wafer processing method includes a foreign matter removing step of removing foreign matter from the wafer when a predetermined period of time has elapsed after performing the cleaning step, the predetermined period of time being set as a period of time until a phosphorus containing reaction product produced at a laser processed portion by performing the laser beam applying step is evaporated to react with water in the air after performing the cleaning step, thereby producing the foreign matter containing phosphorus on the metal electrodes.

Preferably, the front side of the wafer is cleaned with water to thereby remove the foreign matter in the foreign matter removing step. As a modification, the wafer is immersed in water to thereby remove the foreign matter in the foreign matter removing step. As another modification, the wafer is etched to thereby remove the foreign matter in the foreign matter removing step.

According to the wafer processing method of the present invention, the foreign matter produced on the substrate of the wafer after laser processing can be sufficiently suppressed to thereby well maintain the characteristics of each device.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to the preferred embodiment. Further, the components used in the preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
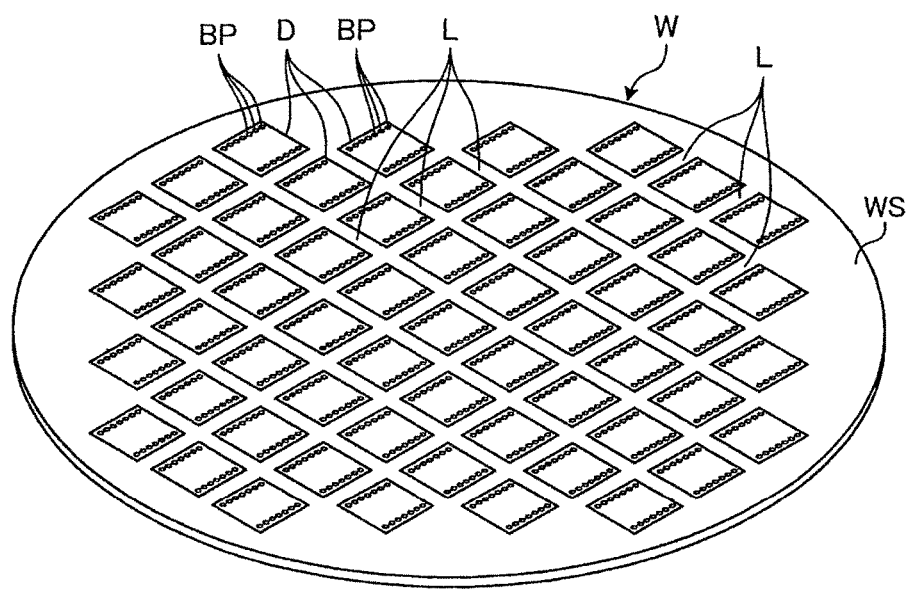
FIG. 1 is a perspective view of a wafer as a workpiece to be processed by a wafer processing method according to a preferred embodiment of the present invention.
Figure 2:
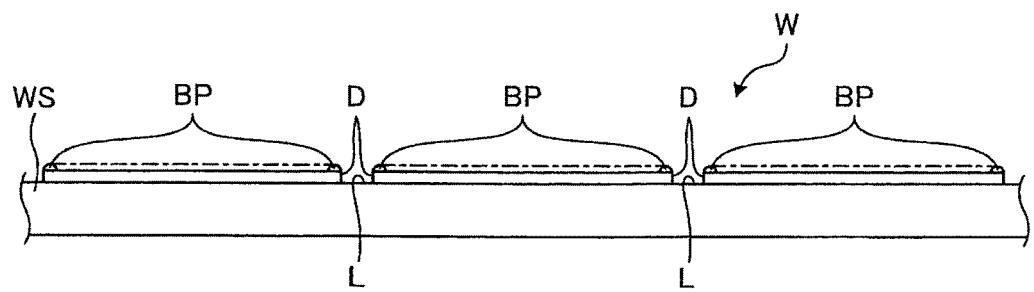
FIG. 2 is a side view of an essential part of the wafer shown in FIG. 1.

A wafer processing method according to the preferred embodiment will now be described with reference to the drawings. FIG. 1 is a perspective view of a wafer as a workpiece to be processed by the wafer processing method according to the preferred embodiment, and FIG. 2 is a side view of an essential part of the wafer shown in FIG. 1. As shown in FIG. 1, a wafer (workpiece) W is a semiconductor wafer or optical device wafer having a disk-shaped substrate WS. The substrate WS of the wafer W is formed of a phosphorus compound (e.g., InP: indium phosphide). As shown in FIGS. 1 and 2, a plurality of crossing streets L are formed on the front side of the wafer W (the front side of the substrate WS) to thereby define a plurality of separate regions where a plurality of devices D are individually formed. A plurality of bumps BP (corresponding to metal electrodes) are formed on the front side of each device D so as to project therefrom. These bumps BP are formed of noble metal such as gold (Au) and platinum (Pt). The number, position, and size of the bumps BP formed on each device D are not limited to those shown in FIG. 1, but they may be suitably changed, provided that the bumps BP are exposed to the front side of each device D. Further, while the bumps BP are used as an example of the metal electrodes in the preferred embodiment, the metal electrodes may be provided by electrodes so formed as to be flush with the front side of each device D in the present invention.

Figure 3:
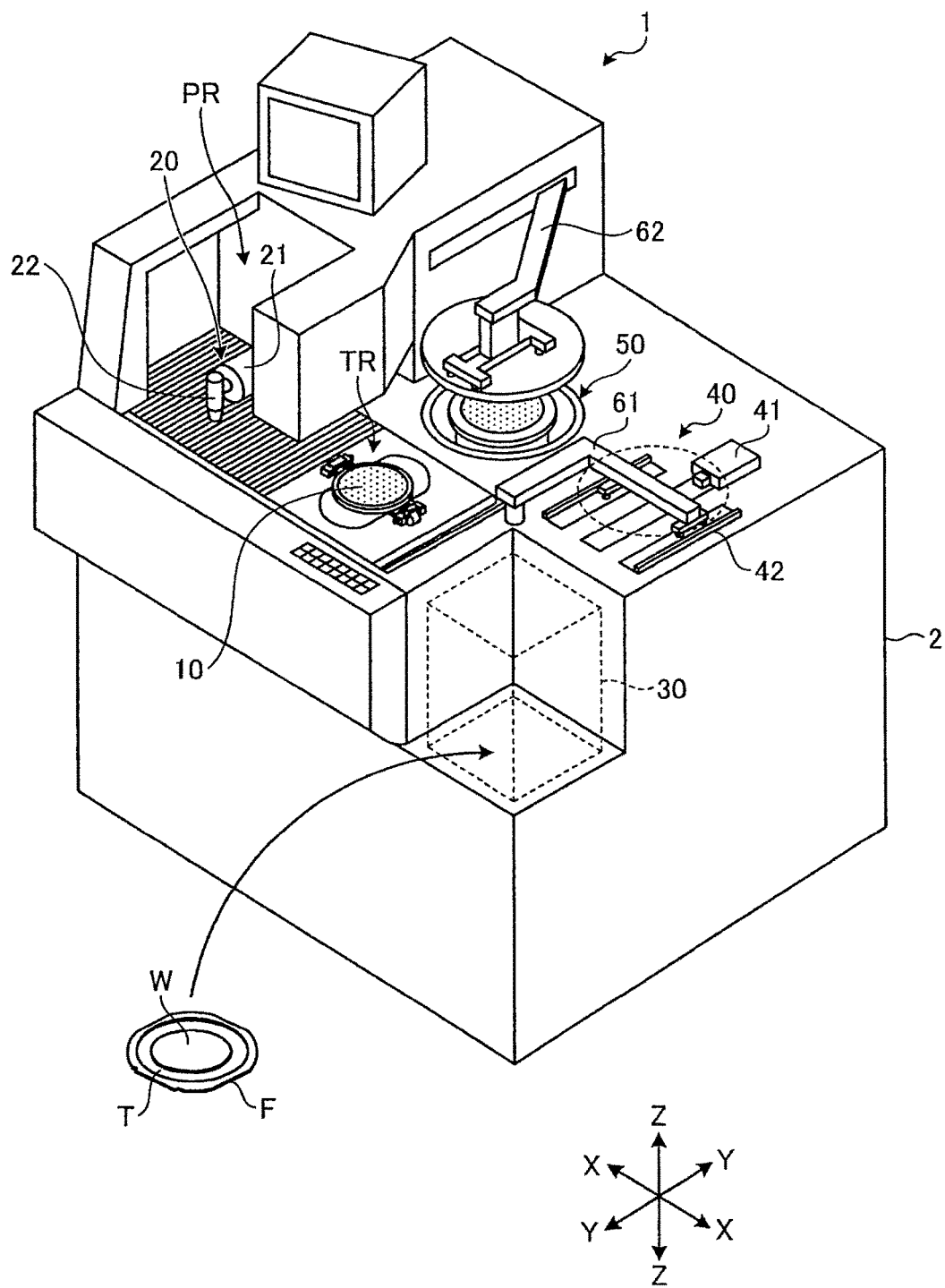
FIG. 3 is a perspective view showing the configuration of a laser processing apparatus.
Figure 4:
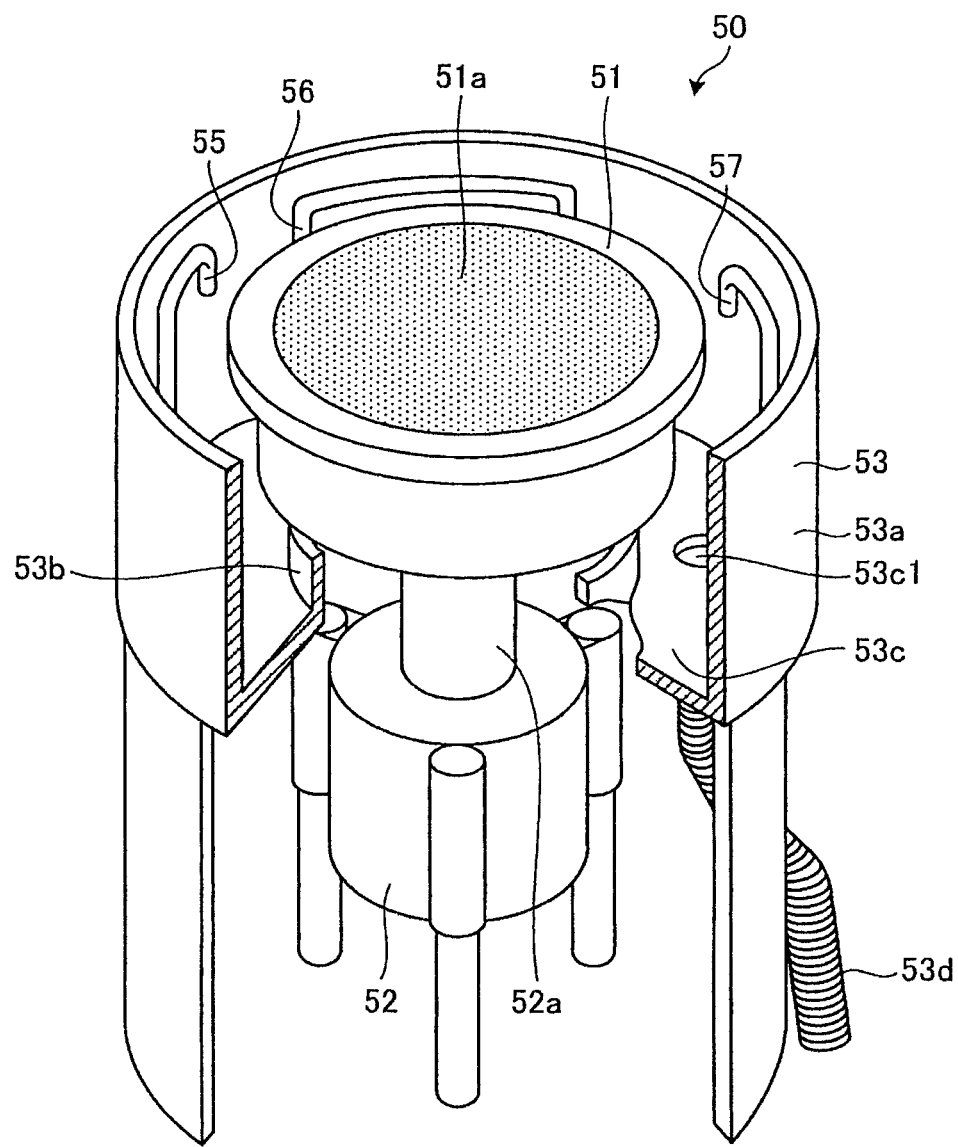
FIG. 4 is a perspective view showing the configuration of a protective film forming and cleaning unit included in the laser processing apparatus shown in FIG. 3.

FIG. 3 is a perspective view showing the configuration of a laser processing apparatus to be used in the wafer processing method according to the preferred embodiment, and FIG. 4 is a perspective view showing the configuration of a protective film forming and cleaning unit included in the laser processing apparatus shown in FIG. 3. The configuration of a laser processing apparatus 1 shown in FIG. 3 is merely illustrative. The laser processing apparatus 1 is designed so as to form a water-soluble soluble protective film P (which will be hereinafter referred to simply as protective film P) (see FIG. 8) on the front side of the wafer W and to next form a laser processed groove PD (see FIG. 11) along each street L by applying a laser beam. Further, the laser processing apparatus 1 is designed so as to remove the protective film P from the front side of the wafer W after forming the laser processed groove PD along each street L.

As shown in FIG. 3, the laser processing apparatus 1 includes a chuck table 10 and a laser beam applying unit 20. The laser processing apparatus 1 further includes a cassette elevator (not shown) for mounting a cassette 30 for storing a plurality of wafers W before or after laser processing, a temporary setting unit 40 for temporarily setting the wafer W before or after laser processing, and a protective film forming and cleaning unit 50 for forming a protective film P on the wafer W before laser processing and removing the protective film P from the wafer W after laser processing. The laser processing apparatus 1 further includes X moving means (not shown) for relatively moving the chuck table 10 and the laser beam applying unit 20 in the X direction shown by an arrow X, Y moving means (not shown) for relatively moving the chuck table 10 and the laser beam applying unit 20 in the Y direction shown by an arrow Y, and Z moving means (not shown) for relatively moving the chuck table 10 and the laser beam applying unit 20 in the Z direction shown by an arrow Z.

The chuck table 10 functions to hold the wafer W in laser processing the wafer W in the condition where the protective film P is formed on the wafer W. The chuck table 10 has an upper surface as a disk-shaped holding portion formed of porous ceramic or the like. This holding portion is connected through a suction passage (not shown) to a vacuum source (not shown), so that the wafer W placed on the holding portion of the chuck table 10 can be held under suction by applying a vacuum generated from the vacuum source. The chuck table 10 is movable between a standby position TR near the cassette 30 where the wafer W is loaded or unloaded with respect to the chuck table 10 before or after laser processing and a processing position PR near the laser beam applying unit 20 where laser processing is performed to the wafer W held on the chuck table 10. In the preferred embodiment, the chuck table 10 is designed to be moved in the X direction by operating the X moving means and also to be moved in the Y direction by operating the Y moving means. Further, the chuck table 10 is rotatable about its axis (parallel to the Z direction) by operating a rotational drive source (not shown).

The laser beam applying unit 20 is provided above the processing position PR formed on a base housing 2 constituting the laser processing apparatus 1. The laser beam applying unit 20 functions to apply a laser beam LB (see FIG. 9) to the front side of the wafer W held on the chuck table 10, thereby forming the laser processed groove PD along each street L. The laser beam LB is a laser beam having an absorption wavelength to the wafer W. The laser beam applying unit 20 is movable in the Z direction by operating the Z moving means with respect to the wafer W held on the chuck table 10. The laser beam applying unit 20 includes an oscillator 21 for oscillating the laser beam LB and focusing means 22 for focusing the laser beam LB oscillated by the oscillator 21. The frequency of the laser beam LB to be oscillated by the oscillator 21 is suitably adjusted according to the kind of the wafer W, the form of processing, etc. Examples of the oscillator 21 include a YAG laser oscillator and a YVO4 laser oscillator. The focusing means 22 includes a total reflection mirror for changing the traveling direction of the laser beam LB oscillated by the oscillator 21 and a focusing lens for focusing the laser beam LB reflected by the total reflection mirror.

The cassette 30 is designed so as to store a plurality of wafers W in the condition where each wafer W is supported through an adhesive tape T to an annular frame F. The cassette elevator is provided in the base housing 2 of the laser processing apparatus 1 so as to be vertically movable in the Z direction. The temporary setting unit 40 functions to take one of the plural wafers W before laser processing out of the cassette 30 and also to take the wafer W after laser processing into the cassette 30. More specifically, the temporary setting unit 40 includes handling means 41 for taking the wafer W before laser processing out of the cassette 30 and taking the wafer W after laser processing into the cassette 30 and a pair of rails 42 for temporarily setting the wafer W before or after laser processing thereon.

First transfer means 61 is provided to transfer the wafer W from the rails 42 of the temporary setting unit 40 to the protective film forming and cleaning unit 50 for forming the protective film P on the wafer W before laser processing. Second transfer means 62 is provided to transfer the wafer W from the chuck table 10 to the protective film forming and cleaning unit 50 for removing the protective film P from the wafer W after laser processing. The first and second transfer means 61 and 62 are designed so as to hold the upper surface of the wafer W under suction, lift the wafer W, and then transfer the wafer W to a desired position.

As shown in FIG. 4, the protective film forming and cleaning unit 50 includes a spinner table 51 for holding the wafer W before or after laser processing, an electric motor 52 for rotating the spinner table 51 about its axis parallel to the Z direction, and a fluid receptacle 53 provided around the spinner table 51. The spinner table 51 has an upper surface as a holding portion such that a disk-shaped vacuum chuck 51a formed of porous ceramic is exposed to the upper surface at its central portion. The vacuum chuck 51a is connected to suction means (not shown). Accordingly, the wafer W placed on the vacuum chuck 51a of the spinner table 51 can be held under suction.

The electric motor 52 has a drive shaft 52a. The spinner table 51 is connected to the upper end of the drive shaft 52a of the electric motor 52, so that the spinner table 51 is rotatably supported to the drive shaft 52a. The fluid receptacle 53 is an annular member composed of a cylindrical outer wall 53a, a cylindrical inner wall 53b formed radially inside of the outer wall 53a, and a bottom wall 53c for connecting the outer wall 53a and the inner wall 53b at their lower ends. The fluid receptacle 53 functions to receive an excess amount of liquid resin LR (see FIG. 7) supplied to the front side of the wafer W in forming the protective film P and an excess amount of cleaning water RW1 (see FIG. 12) supplied to the front side of the wafer W in removing the protective film P. The bottom wall 53c is formed with a drain hole 53c1, and a drain hose 53d is connected to the drain hole 53c1.

The protective film forming and cleaning unit 50 further includes a liquid resin nozzle 55 for supplying a water-soluble liquid resin LR to the wafer W held on the spinner table 51 in forming the protective film P before laser processing, a cleaning water nozzle 57 for supplying a cleaning water RW1 to the wafer W held on the spinner table 51 in removing the protective film P after laser processing, and an air nozzle 56 for supplying air to the wafer W held on the spinner table 51 after supplying the liquid resin LR or the cleaning water RW1. Each of the nozzles 55, 56, and 57 has a nozzle opening, which is movable between an operating position above the center of the spinner table 51 and a retracted position retracted from the spinner table 51.

The liquid resin nozzle 55 is connected to a liquid resin source (not shown). Examples of the water-soluble liquid resin LR include PVA (polyvinyl alcohol), PEG (polyethylene glycol), and PVP (polyvinyl pyrrolidone). The liquid resin LR is solidified by drying to form the protective film P on the front side of the wafer W. The protective film P functions to protect the devices D formed on the front side of the wafer W.

The cleaning water nozzle 57 is connected to a cleaning water (e.g., pure water) source (not shown). The air nozzle 56 is connected to a dry air source (not shown). Accordingly, the air nozzle 56 functions to blow dry air to the liquid resin LR supplied to the wafer W held on the spinner table 51, thereby drying the liquid resin LR to form the protective film P. The air nozzle 56 also functions to blow dry air to the wafer W after cleaning it with the cleaning water RW1, thereby drying the wafer W.

As described above, the substrate WS of the wafer W in the preferred embodiment is composed of indium phosphide (InP) as a phosphorus compound. Further, the plural bumps BP (metal electrodes) are formed on the front side of each device D. In the case of laser processing this kind of wafer W, the element (phosphorus in the preferred embodiment) constituting the wafer W is liberated (evaporated) and diffused from an exposed work surface of the wafer W by laser processing. This diffused phosphorus reacts with nitrogen, oxygen, or water in the air after removing the protective film P, thereby producing foreign matter AS (see FIG. 13) containing phosphoric acid ($H_3PO_4$) on each bump BP. This foreign matter AS causes a reduction in characteristics (e.g., electrical characteristics) of each device D and it is therefore preferable to remove the foreign matter AS at once. However, since the production speed of the foreign matter AS is low (e.g., two or three days are required until production), it is difficult to remove the foreign matter AS together with the protective film P in cleaning the wafer W. To cope with this problem, the wafer processing method according to the preferred embodiment is characterized in that the generation of the foreign matter AS containing phosphorus on the front side of each device D (particularly, the bumps BP) can be suppressed by this method.

Figure 5:
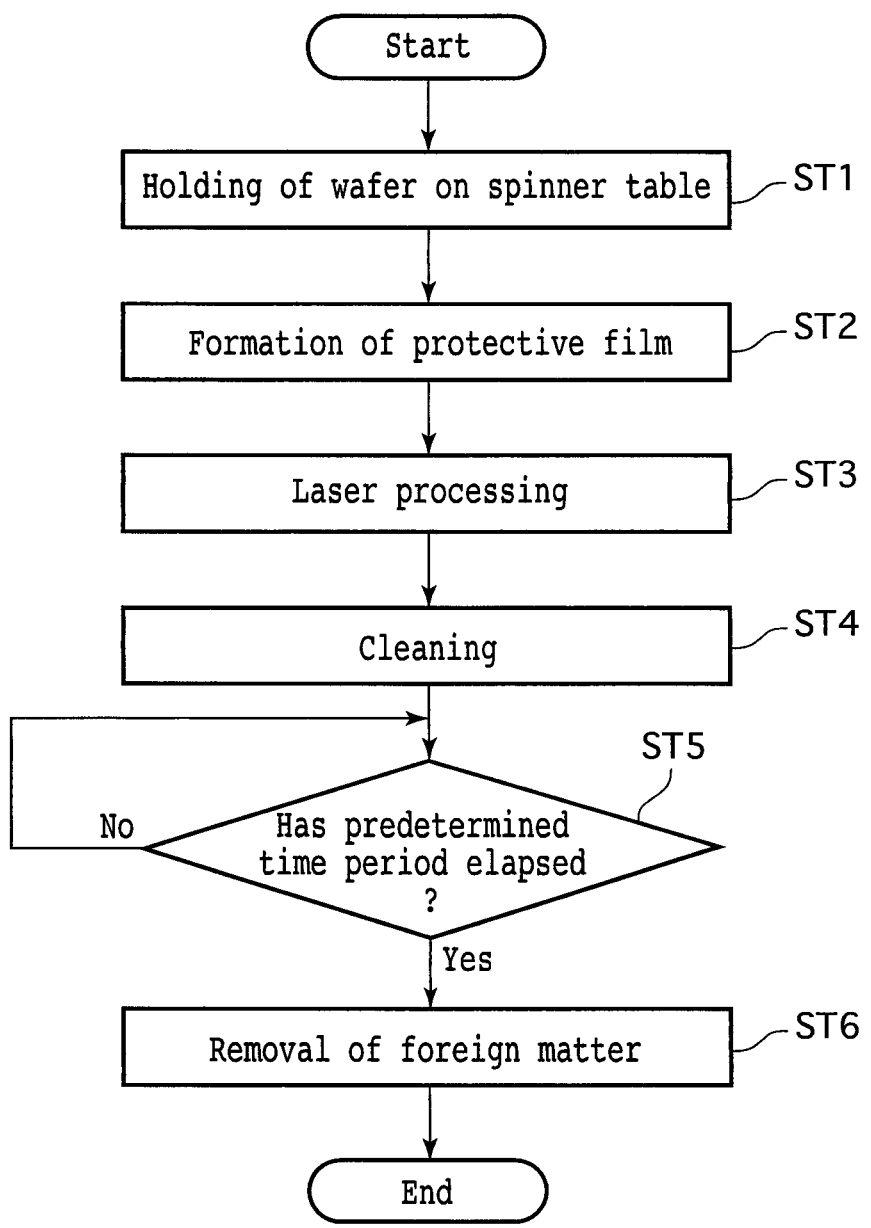
FIG. 5 is a flowchart showing the procedure of the wafer processing method according to the preferred embodiment.

The wafer processing method according to the preferred embodiment will now be described in detail with reference to FIGS. 5 to 14. The wafer processing method is a method of laser processing the wafer W along each street L, and this method includes a wafer holding step ST1, a protective film forming step ST2, a laser beam applying step ST3, a cleaning step ST4, and a foreign matter removing step ST6 as shown in FIG. 5. Prior to performing the wafer holding step ST1, the adhesive tape T is attached to the back side of the wafer W having the plural devices D formed on the front side. Further, the annular frame F is attached to the adhesive tape T so as to surround the wafer W. The wafer W thus supported through the adhesive tape T to the annular frame F is stored into the cassette 30, and the cassette 30 is set on the cassette elevator.

Figure 6:
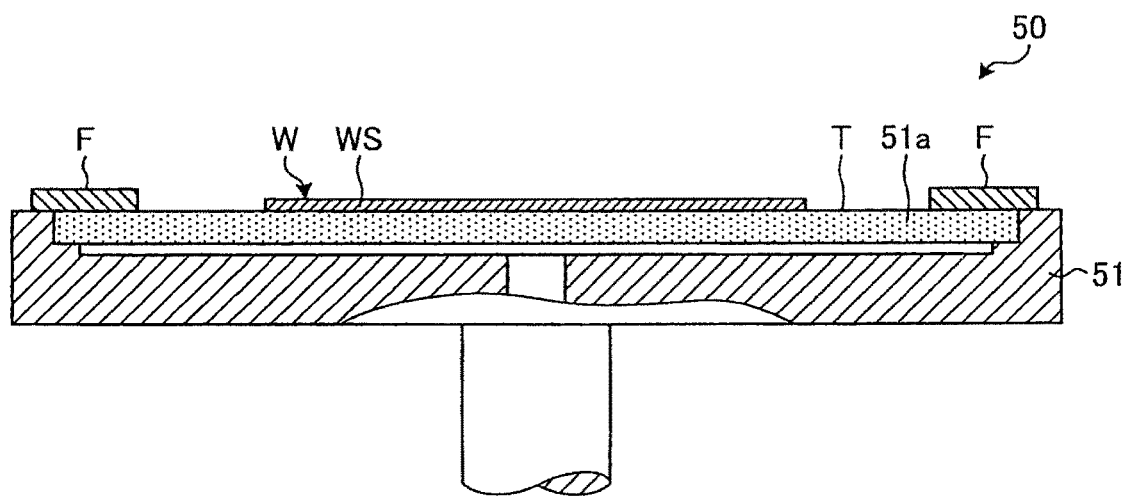
FIG. 6 is a sectional view for illustrating a wafer holding step.

An operator operates the laser processing apparatus 1 to record processing information into control means included in the laser processing apparatus 1. When receiving an instruction of starting a processing operation from the operator, the laser processing apparatus 1 starts the processing operation, i.e., the wafer processing method. In the wafer holding step ST1, the control means operates the handling means 41 to take the wafer W before laser processing out of the cassette 30 and carry it to the pair of rails 42 of the temporary setting unit 40. The wafer W is temporarily set on the pair of rails 42. Thereafter, the control means operates the first transfer means 61 to transfer the wafer W from the rails 42 to the spinner table 51 of the protective film forming and cleaning unit 50. In this manner, the wafer W is held on the spinner table 51 as shown in FIG. 6. Thereafter, the operation proceeds to the protective film forming step ST2.

Figure 7:
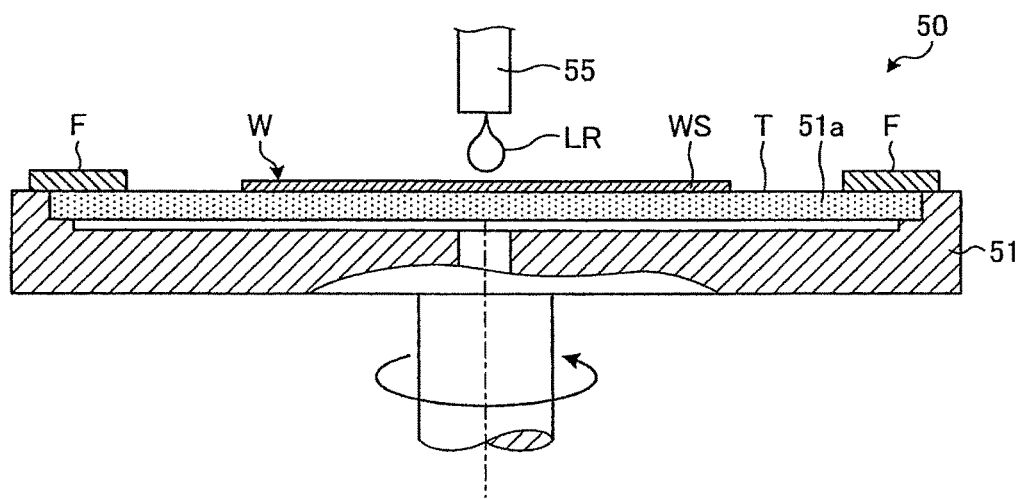
FIG. 7 is a sectional view for illustrating a protective film forming step.
Figure 8:
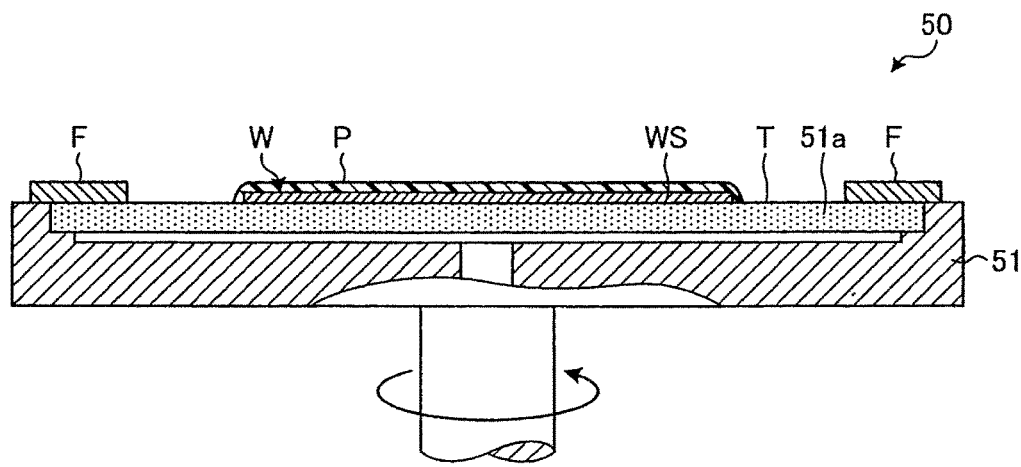
FIG. 8 is a sectional view showing the condition obtained by performing the protective film forming step.

In the protective film forming step ST2, the control means operates to form the protective film P on the front side of the wafer W. More specifically, as shown in FIG. 7, the control means moves the nozzle opening of the liquid resin nozzle 55 to the position above the center of the wafer W and also rotates the spinner table 51 at a predetermined speed. In this condition, the control means supplies the water-soluble liquid resin LR (e.g., PVA, or polyvinyl alcohol) from the liquid resin nozzle 55 to the wafer W. Due to a centrifugal force generated by the rotation of the spinner table 51, the liquid resin LR supplied is spread radially outward from the center of the wafer W, so that the protective film P having a uniform thickness can be formed. After supplying the liquid resin LR for a predetermined period of time and then solidifying the same, the control means retracts the nozzle opening of the liquid resin nozzle 55 from the upper side of the wafer W. As a result, the protective film P is formed on the front side of the wafer W as shown in FIG. 8. Thereafter, the operation proceeds to the laser beam applying step ST3.

Figure 9:
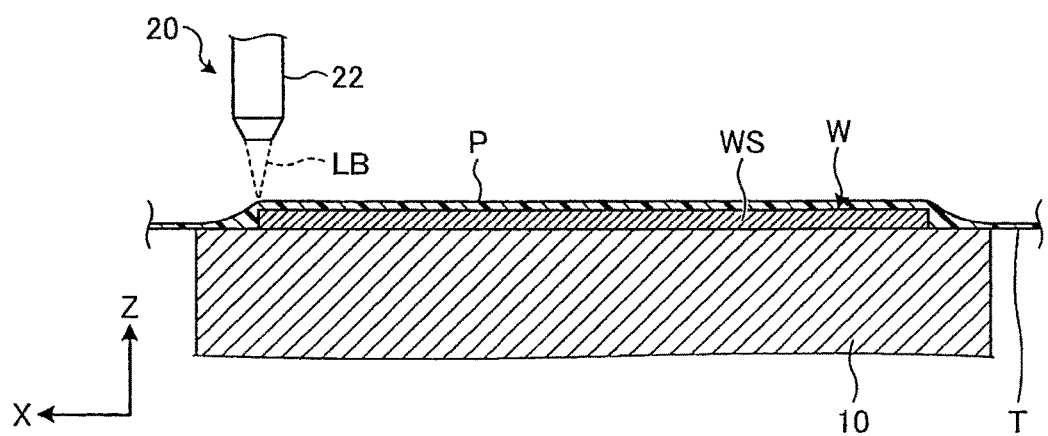
FIG. 9 is a sectional view for illustrating a laser beam applying step.

In the laser beam applying step ST3, the control means operates to apply the laser beam LB to the wafer W along each street L. More specifically, the control means operates the second transfer means 62 to transfer the wafer W from the spinner table 51 of the protective film forming and cleaning unit 50 to the chuck table 10 and next operates the suction means to hold the wafer W on the chuck table 10 under suction. Further, the control means operates the X moving means and the Y moving means to move the chuck table 10 in the X direction and the Y direction and then operates the rotational drive source to rotate the chuck table 10 about its axis. Further, the control means operates the Z moving means to move the laser beam applying unit 20 in the Z direction. In this manner, one end of a predetermined one of the streets L is positioned directly below the focusing means 22 as shown in FIG. 9. Thereafter, the control means operates the laser beam applying unit 20 to apply the laser beam LB from the focusing means 22 to the wafer W and simultaneously operates the X moving means to move the chuck table 10 holding the wafer W in the X direction at a predetermined feed speed. Accordingly, the chuck table 10 is moved in the X direction with respect to the laser beam applying unit 20, and the laser beam LB is applied along the predetermined street L.

Figure 10:
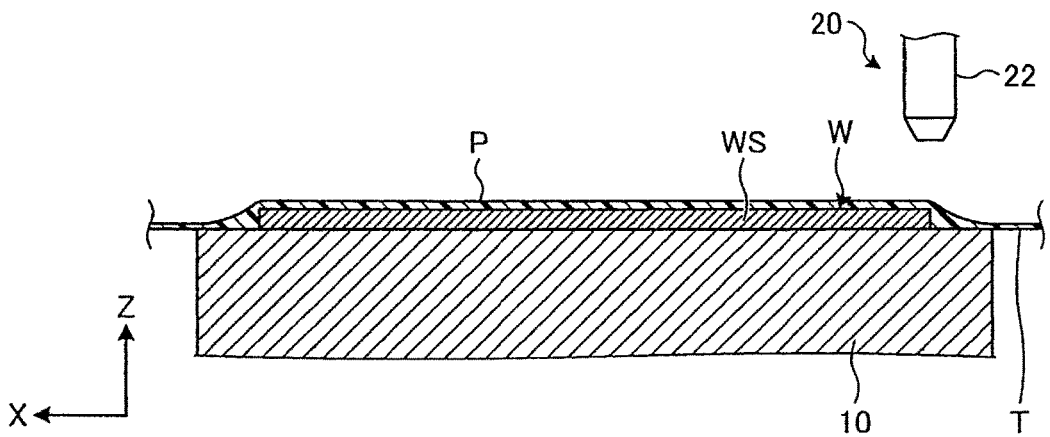
FIG. 10 is a sectional view showing the condition obtained by performing the laser beam applying step.
Figure 11:
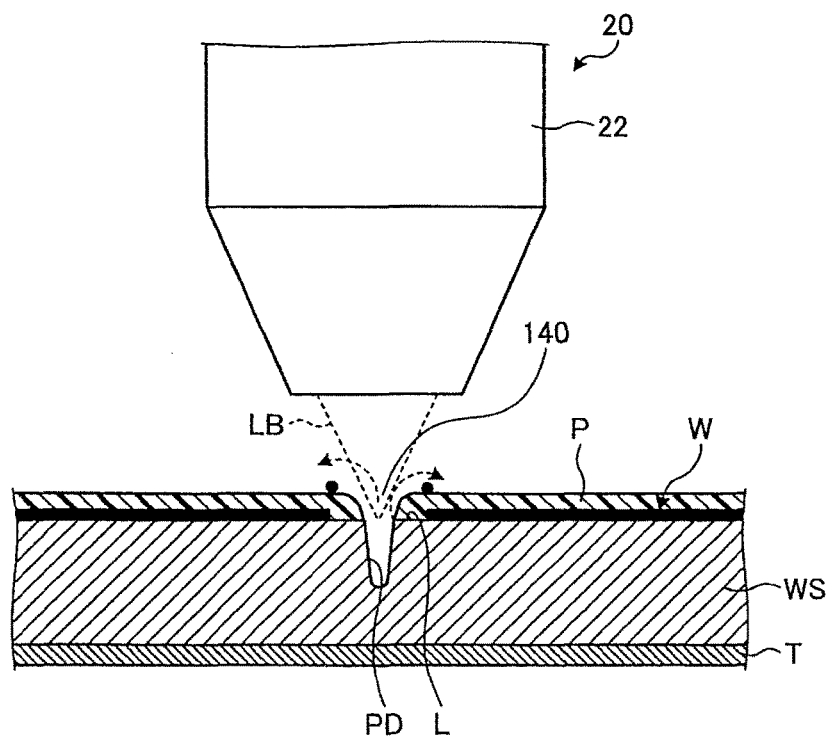
FIG. 11 is an enlarged sectional view of an essential part of the wafer for illustrating the formation of a laser processed groove in the laser beam applying step.

As a result, the substrate WS of the wafer W and the protective film P formed on the front side of the wafer W are partially sublimed by the ablation using the laser beam LB to form a laser processed groove PD on the front side of the wafer W along the predetermined street L as shown in FIG. 11. When the other end of the predetermined street L has reached the position directly below the focusing means 22 as shown in FIG. 10, the control means stops the operation of the laser beam applying unit 20 and the X moving means to thereby stop the application of the laser beam LB and the movement of the chuck table 10. Thereafter, the control means similarly performs the above processing along all of the other streets L to thereby form a plurality of similar laser processed grooves PD along all of the other streets L. Thereafter, the operation proceeds to the cleaning step ST4.

Figure 12:
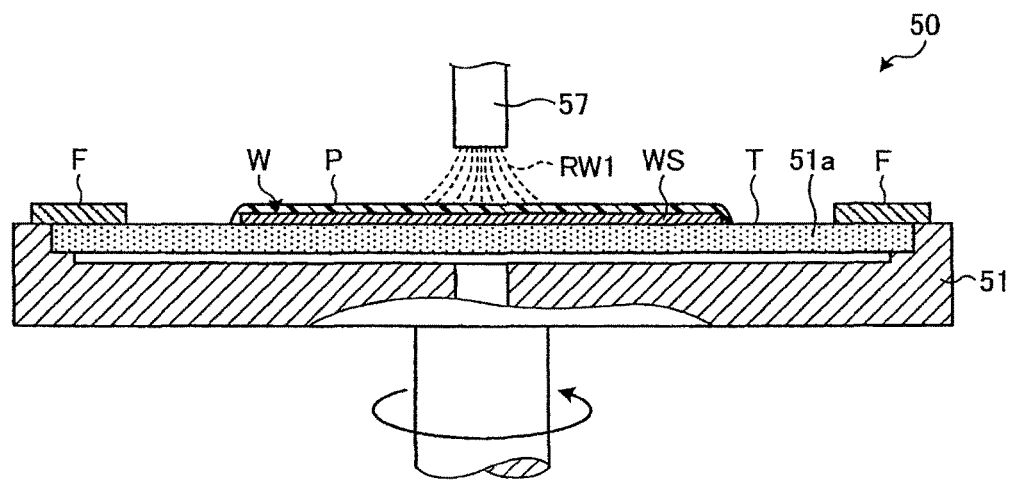
FIG. 12 is a sectional view for illustrating a cleaning step.

In the cleaning step ST4, the control means operates to clean the wafer W with the cleaning water RW1 and thereby remove the protective film P from the wafer W. More specifically, the control means operates the second transfer means 62 to transfer the wafer W after laser processing from the chuck table 10 to the spinner table 51 of the protective film forming and cleaning unit 50. Thereafter, the control means operates the suction means to hold the wafer W on the vacuum chuck 51a of the spinner table 51 under suction. As shown in FIG. 12, the control means moves the nozzle opening of the cleaning water nozzle 57 to the position above the center of the wafer W and also rotates the spinner table 51 at a predetermined speed. In this condition, the control means supplies pure water as the cleaning water RW1 from the cleaning water nozzle 57 to the wafer W for a predetermined period of time. As described above, the protective film P is formed by drying the water-soluble liquid resin LR applied to the wafer W. Accordingly, by supplying the cleaning water RW1 toward the protective film P, the protective film P is dissolved in the cleaning water RW1 and then removed from the front side of the wafer W. At this time, debris generated from the wafer W by the laser processing is also removed together with the protective film P from the front side of the wafer W. After supplying the cleaning water RW1 for a predetermined period of time, the control means retracts the nozzle opening of the cleaning water nozzle 57 from the upper side of the wafer W. Thereafter, the control means moves the nozzle opening of the air nozzle 56 to the position above the center of the wafer W and then supplies dry air from the air nozzle 56 to the wafer W for a predetermined period of time, thereby drying the front side of the wafer W. As a modification, the control means may swing the cleaning nozzle 57 and the air nozzle 56 as supplying the cleaning water RW1 and the dry air from the respective nozzle openings in the cleaning step ST4.

Figure 13:
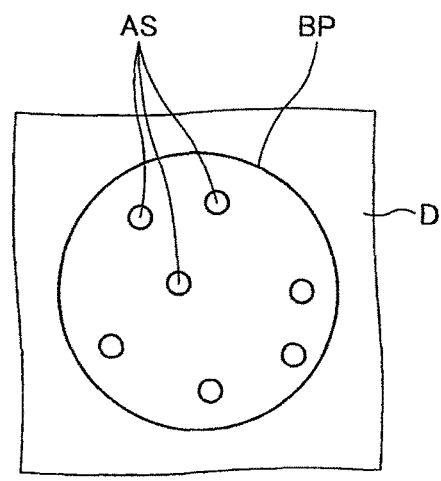
FIG. 13 is a plan view for illustrating the production of foreign matter on the front side of a bump after performing the cleaning step.

After performing the cleaning step ST4, the control means operates the first transfer means 61 to transfer the wafer W from the spinner table 51 to the rails 42 and next operates the handling means 41 to store the wafer W into the cassette 30. Thereafter, the control means similarly performs the wafer holding step ST1, the protective film forming step ST2, the laser beam applying step ST3, and the cleaning step ST4 for all of the other wafers W stored in the cassette 30, and then stores all of the other wafers W after performing these steps ST1, ST2, ST3, and ST4. Thereafter, the operator removes the cassette 30 from the cassette elevator, next transfers the cassette 30 to a storage space, and then stores the cassette 30 in this storage space. Thereafter, the operator judges whether or not a predetermined period of time has elapsed after performing the cleaning step ST4 (step ST5). The predetermined period of time mentioned above means a period of time until a reaction product produced at a laser processed portion (including the laser processed grooves PD and an area in the vicinity of the laser processed grooves PD) of the wafer W by performing the laser beam applying step ST3 (the reaction product containing the element constituting the wafer W, e.g., phosphorus) is evaporated to react with nitrogen, oxygen, or water in the air after performing the cleaning step ST4, thereby producing the foreign matter AS (phosphoric acid, or $H_3PO_4$) containing phosphorus on each bump BP as shown in FIG. 13. For example, this predetermined period of time is two or three days. However, this predetermined period of time defined in the present invention is not limited to such a time period.

When the operator judges that this predetermined period of time has not elapsed after performing the cleaning step4 (step ST5: No), step ST5 is repeated until the predetermined period of time has elapsed. Conversely, when the operator judges that the predetermined period of time has elapsed after performing the cleaning step ST4 (step ST5: Yes), the foreign matter AS has been produced on the front side of each bump BP as shown in FIG. 13. Thereafter, the operation proceeds to the foreign matter removing step ST6.

Figure 14:
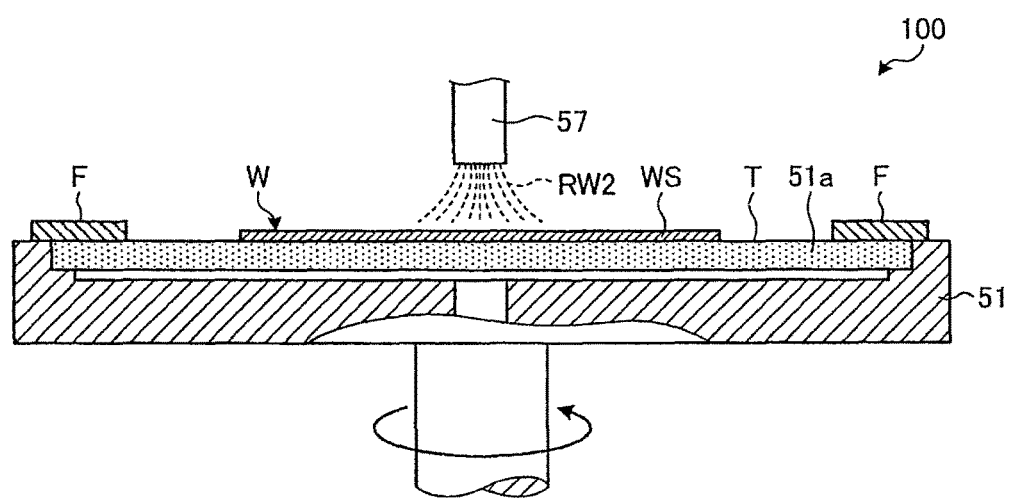
FIG. 14 is a sectional view for illustrating a foreign matter removing step.

The foreign matter removing step ST6 is the step of removing the foreign matter AS when the predetermined period of time has elapsed after performing the cleaning step ST4. The foreign matter removing step ST6 is performed by using a cleaning apparatus 100 similar in configuration to the protective film forming and cleaning unit 50 as shown in FIG. 14. The configuration of the cleaning apparatus 100 is similar to that of the protective film forming and cleaning unit 50 except that the liquid resin nozzle 55 is not included. Accordingly, the description of the configuration of the cleaning apparatus 100 will be omitted herein.

In the foreign matter removing step ST6, a working apparatus (not shown) or the operator takes one of the wafers W out of the cassette 30 and transfers the wafer W to the spinner table 51 of the cleaning apparatus 100. The wafer W is then held on the spinner table 51 under suction. As shown in FIG. 14, the cleaning apparatus 100 is operated to move the nozzle opening of the cleaning water nozzle 57 to the position above the center of the wafer W and also to rotate the spinner table 51 at a predetermined speed. In this condition, pure water as a cleaning water RW2 is supplied from the cleaning water nozzle 57 to the wafer W for a predetermined period of time. Phosphoric acid ($H_3PO_4$) constituting the foreign matter AS is water-soluble. Accordingly, by supplying the cleaning water RW2 toward the foreign matter AS, the foreign matter AS is dissolved in the cleaning water RW2 and then removed from the front side of the wafer W. While pure water is used as the cleaning water RW2 in the preferred embodiment, the cleaning water RW2 is not limited to pure water in the present invention. In this manner, the front side of the wafer W is cleaned with water (pure water) to thereby remove the foreign matter AS in the foreign matter removing step ST6. As a modification, an acid or alkaline corrosive etching liquid may be used as the cleaning water RW2. In this case, the foreign matter AS is dissolved in the etching liquid as the cleaning water RW2 and then removed from the wafer W. That is, the front side of the wafer W may be etched to thereby remove the foreign matter AS in the foreign matter removing step ST6.

After supplying the cleaning water RW2 for a predetermined period of time in the cleaning apparatus 100, the nozzle opening of the cleaning water nozzle 57 is retracted from the upper side of the wafer W. Thereafter, the nozzle opening of the air nozzle 56 of the cleaning apparatus 100 is moved to the position above the center of the wafer W, and dry air is supplied from the air nozzle 56 to the wafer W for a predetermined period of time, thereby drying the front side of the wafer W. As a modification, the cleaning nozzle 57 and the air nozzle 56 of the cleaning apparatus 100 may be swung as supplying the cleaning water RW2 and the dry air from the respective nozzle openings in the foreign matter removing step ST6. In the case of using an etching liquid as the cleaning water RW2 in the cleaning apparatus 100 as mentioned above, it is preferable to supply pure water to the wafer W after supplying the etching liquid to the wafer W and to next dry the wafer W.

After performing the foreign matter removing step ST6, the working apparatus or the operator stores the wafer W into the cassette 30. Thereafter, the working apparatus or the operator similarly performs the foreign matter removing step ST6 for all of the other wafers W stored in the cassette 30, thus finishing the wafer processing method according to the preferred embodiment. Thereafter, the cassette 30 storing the wafers W is transferred to any apparatus for performing a dividing step as the next step, in which each wafer W is divided along the laser processed grooves PD formed by ablation, thereby obtaining a plurality of individual device chips corresponding to the plural devices D.

According to the wafer processing method described above, when the predetermined period of time required for production of the foreign matter AS on each bump BP has elapsed after performing the cleaning step ST4, the cleaning water RW2 is supplied to the front side of the wafer W to thereby remove the foreign matter AS, i.e., to perform the foreign matter removing step ST6. Further, pure water as the cleaning water RW2 is supplied in the foreign matter removing step ST6. Since the foreign matter AS is constituted of phosphoric acid ($H_3PO_4$), which is water-soluble, the foreign matter AS produced on the substrate WS of the wafer W after laser processing can be sufficiently removed by a simple method of supplying the cleaning water RW2. As a result, the production of the foreign matter AS on the front side of each device D can be effectively suppressed to thereby well maintain the characteristics of each device D.

The foreign matter removing step ST6 is performed after the predetermined period of time has elapsed as mentioned above, wherein during this predetermined period of time the reaction product produced in the laser beam applying step ST3 sufficiently reacts with water in the air to produce the foreign matter AS. Accordingly, after the foreign matter AS is once removed, re-generation of the foreign matter AS can be suppressed. As a result, the production of the foreign matter AS on the front side of each device D can be effectively suppressed to thereby well maintain the characteristics of each device D. In the case of etching the wafer W to remove the foreign matter AS, the required time for the foreign matter removing step ST6 can be reduced because the etching liquid to be used as the cleaning water RW2 is corrosive.

Figure 15:
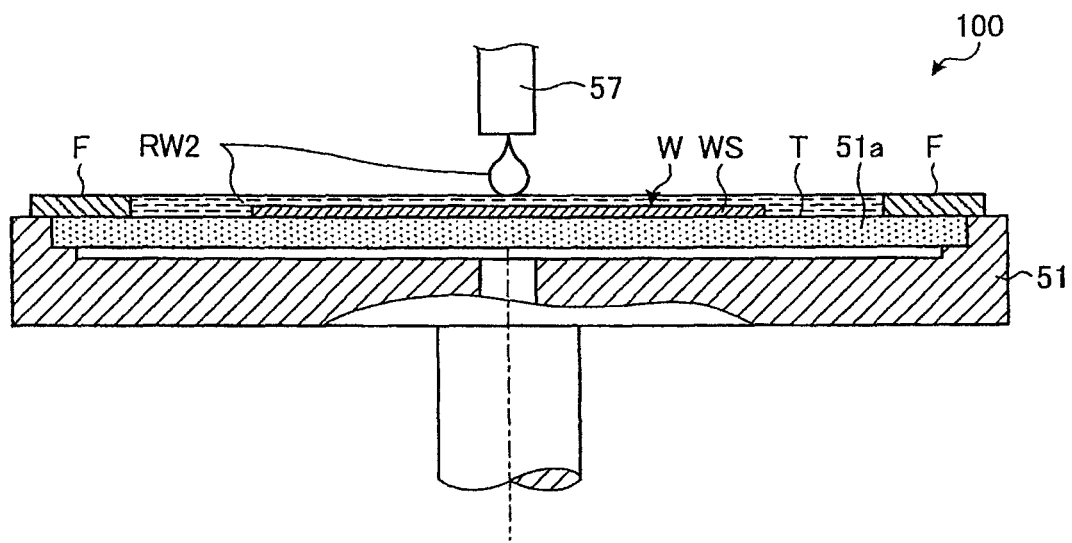
FIG. 15 is a sectional view for illustrating a foreign matter removing step according to a modification of the preferred embodiment.

A wafer processing method according to a modification of the preferred embodiment will now be described with reference to FIG. 15. FIG. 15 is a sectional view for illustrating a modification of a foreign matter removing step. In FIG. 15, the same parts as those in the above preferred embodiment are denoted by the same reference symbols, and the description thereof will be omitted herein.

In the wafer processing method according to the modification, all the steps other than the foreign matter removing step ST6 are the same as those in the above preferred embodiment. As shown in FIG. 15, the wafer W is held on the chuck table 51 of the cleaning apparatus 100, and the nozzle opening of the cleaning water nozzle 57 of the cleaning apparatus 100 is moved to the position above the center of the wafer W. In this condition, a predetermined amount of pure water as the cleaning water RW2 is supplied from the cleaning water nozzle 57 to the wafer W without rotating the spinner table 51. As a result, the cleaning water RW2 is accumulated inside the frame F as shown in FIG. 15, so that the wafer W is immersed in the cleaning water RW2 accumulated inside the frame F. When the wafer W is immersed in the cleaning water RW2, the foreign matter AS is dissolved in the cleaning water RW2 because phosphoric acid ($H_3PO_4$) constituting the foreign matter AS is water-soluble. Accordingly, the foreign matter AS is removed from the front side of the wafer W. While pure water is used as the cleaning water RW2 in the modification, the cleaning water RW2 is not limited to pure water. In this manner, the wafer W is immersed in water (pure water) to remove the foreign matter As in the foreign matter removing step ST6 according to the modification. Thereafter, the spinner table 51 is rotated at a predetermined speed, and the cleaning water RW2 is supplied from the cleaning water nozzle 57 to the wafer W for a predetermined period of time to thereby clean the wafer W. Thereafter, dry air is supplied from the air nozzle 56 to the wafer W for a predetermined period of time to thereby dry the front side of the wafer W.

Also according to the modification, the following effect can be attained. Since the foreign matter AS is constituted of phosphoric acid ($H_3PO_4$), which is water-soluble, the foreign matter AS produced on the substrate WS of the wafer W after laser processing can be sufficiently removed by a simple method of supplying the cleaning water WR2. As a result, the production of the foreign matter AS on the front side of each device D can be effectively suppressed to thereby well maintain the characteristics of each device D.

The present inventors confirmed the effect of the wafer processing method according to the preferred embodiment. The results are shown in Table 1.

TABLE 1

| | Presence/absence of foreign matter |
|---|---|
| Present Invention | Absent |
| Comparison 1 | Present |
| Comparison 2 | Present |

In Table 1, Present Invention corresponds to the wafer processing method according to the preferred embodiment. Comparison 1 corresponds to a method such that the cleaning step ST4 was not performed, i.e., the protective film P was not removed after performing the laser beam applying step ST3, and after the elapse of a predetermined time period (e.g., two or three days) the cleaning step ST4 was performed to remove the protective film P. Comparison 2 corresponds to a method such that the cleaning step ST4 was performed after performing the laser beam applying step ST3, and the front side of each device D was kept oriented downward for a predetermined time period (e.g., two or three days). Both in Comparison 1 and in Comparison 2, the foreign matter removing step ST6 was not performed.

As shown in Table 1, the foreign matter AS was produced on the front side of each bump BP both in Comparision 1 and in Comparison 2, whereas the foreign matter AS was not produced on the front side of each bump BP in Present Invention. As apparent from Table 1, the production of the foreign matter AS on the front side of each bump BP can be suppressed by performing the foreign matter removing step ST6 when the predetermined time period has elapsed after performing the cleaning step ST4. That is, the foreign matter AS is sufficiently produced on the front side of each bump BP during this predetermined time period after performing the cleaning step ST4. Accordingly, when this predetermined time period has elapsed, the foreign matter removing step ST6 is performed by supplying the cleaning water RW2 to the front side of the wafer W to remove the foreign matter AS.

The present invention is not limited to the preferred embodiment and the modification mentioned above. That is, various modifications may be made without departing from the scope of the present invention. For example, in the case of using pure water as the cleaning water RW1 and the cleaning water RW2, a chemical liquid having an amino group may be added to the cleaning waters RW1 and RW2. In the case that the chemical liquid having an amino group (e.g., MEA, or monoethanol amine) is added to the cleaning waters RW1 and RW2, the amino group contained in the monoethanol amine reacts with the phosphorus diffused from the laser processed grooves PD of the wafer W, thereby producing a phosphorus containing compound such as ammonium phosphate $(NH_4)_3PO_4$. This compound (ammonium phosphate) is water-soluble and its reaction (production) time is shorter than that of phosphoric acid $(H_3PO_4)$. Accordingly, by adding the chemical liquid having an amino group to the cleaning waters RW1 and RW2 to thereby produce the phosphorus containing compound (ammonium phosphate), the production of the foreign matter AS containing phosphoric acid $(H_3PO_4)$ can be suppressed.

Examples of the chemical liquid having an amino group include a high-molecular compound such as PAA (polyallyl amine) (registered trademark) and PEI (polyethylene imine) and a low-molecular compound such as MEA (monoethanol amine) and TETA (triethylene tetramine), and also include monoethyl amine, diethyl amine, diisopropyl amine, monoethanol amine, 2-amino ethanol, diethanol amine, triethanol amine, pyridine, N-N-dimethyl formamide, N-2-methyl pyrrolidone. A mixture of two or more of these compounds may be used. Further, the above compounds may be diluted with water.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for laser processing a wafer along a plurality of crossing streets formed on a front side of a substrate, the front side of said substrate being partitioned by said streets to define a plurality of separate regions where a plurality of devices each having metal electrodes are formed, said substrate being formed of a phosphorus compound, said wafer processing method comprising:
   a wafer holding step of holding said wafer on a chuck table;
   a protective film forming step of forming a water-soluble protective film on the front side of said wafer held on said chuck table;
   a laser beam applying step of applying a laser beam to said wafer along said streets after performing said protective film forming step;
   a cleaning step of cleaning said wafer to thereby remove said protective film after performing said laser beam applying step; and
   a foreign matter removing step of removing foreign matter from said wafer when a predetermined period of time has elapsed after performing said cleaning step, said predetermined period of time being set as a period of time until a phosphorus containing reaction product produced at a laser processed portion by performing said laser beam applying step is evaporated to react with water in the air after performing said cleaning step, thereby producing said foreign matter containing phosphorus on said metal electrodes.

2. The wafer processing method according to claim 1, wherein the front side of said wafer is cleaned with water to thereby remove said foreign matter in said foreign matter removing step.

3. The wafer processing method according to claim 1, wherein said wafer is immersed in water to thereby remove said foreign matter in said foreign matter removing step.

4. The wafer processing method according to claim 1, wherein said wafer is etched to thereby remove said foreign matter in said foreign matter removing step.

* * * * *